(12) United States Patent
Koo et al.

(10) Patent No.: US 10,468,534 B2
(45) Date of Patent: Nov. 5, 2019

(54) TRANSISTOR ARRAY PANEL AND MANUFACTURING METHOD THEREOF

(71) Applicant: Samsung Display Co., Ltd., Gyeonggi-do (KR)

(72) Inventors: Bon-Yong Koo, Chungcheongnam-do (KR); Jung-Hun Noh, Gyeonggi-do (KR); Sun Kwang Kim, Seoul (KR); Yeon Kyung Kim, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/866,309

(22) Filed: Jan. 9, 2018

(65) Prior Publication Data

US 2018/0204954 A1    Jul. 19, 2018

(30) Foreign Application Priority Data

Jan. 19, 2017    (KR) .................. 10-2017-0009161

(51) Int. Cl.
*H01L 29/786*    (2006.01)
*H01L 29/49*    (2006.01)
(Continued)

(52) U.S. Cl.
CPC ...... *H01L 29/78642* (2013.01); *H01L 27/124* (2013.01); *H01L 27/1218* (2013.01);
(Continued)

(58) Field of Classification Search
CPC .......... H01L 29/78642; H01L 29/4908; H01L 29/66742; H01L 29/66712; H01L 29/7802;
(Continued)

(56) References Cited

U.S. PATENT DOCUMENTS

2004/0245524 A1* 12/2004 Hirakata ............. H01L 27/1214
257/59
2006/0170634 A1* 8/2006 Kwak .................. G09G 3/3233
345/92

(Continued)

FOREIGN PATENT DOCUMENTS

KR    10-0658068 B1    12/2006
KR    10-2013-0074954 A    7/2013
KR    10-2015-0043864 A    4/2016

OTHER PUBLICATIONS

Hyi-In Yeom, et al., "Oxide Vertical TFTs for the Application to the Ultra High Resolution Display", SID 2016 Digest, pp. 820-822.

*Primary Examiner* — Patricia D Reddington
(74) *Attorney, Agent, or Firm* — Innovation Counsel LLP

(57) ABSTRACT

A transistor array panel according to an exemplary embodiment includes a substrate, and a first transistor and a second transistor positioned on the substrate. Each of the first transistor and the second transistor includes: a first electrode; a second electrode overlapping the first electrode; a spacing member positioned between the first electrode and the second electrode; a semiconductor layer extending along a side wall of the spacing member; and a gate electrode overlapping the semiconductor layer. A thickness of the spacing member of the first transistor is larger than a thickness of the spacing member of the second transistor.

20 Claims, 11 Drawing Sheets

(51) Int. Cl.
*H01L 27/12* (2006.01)
*H01L 29/66* (2006.01)
*H01L 29/423* (2006.01)
*H01L 29/78* (2006.01)

(52) U.S. Cl.
CPC ...... *H01L 27/1225* (2013.01); *H01L 27/1237* (2013.01); *H01L 27/1251* (2013.01); *H01L 27/1259* (2013.01); *H01L 27/1262* (2013.01); *H01L 29/42384* (2013.01); *H01L 29/4908* (2013.01); *H01L 29/66742* (2013.01); *H01L 29/78696* (2013.01); H01L 29/42324 (2013.01); H01L 29/66666 (2013.01); H01L 29/7827 (2013.01); *H01L 2029/42388* (2013.01)

(58) Field of Classification Search
CPC ............... H01L 27/124; H01L 27/1251; H01L 27/1259; H01L 21/82342; H01L 21/82385; H01L 51/057; H01L 29/42324–42336; H01L 29/7827; H01L 29/66666
USPC .......................................................... 257/59
See application file for complete search history.

(56) References Cited

U.S. PATENT DOCUMENTS

2007/0045721 A1* 3/2007 Forbes ................ H01L 29/7391
257/328
2016/0079385 A1 3/2016 Ellinger et al.
2017/0005200 A1* 1/2017 Sasaki ................ H01L 29/7869

\* cited by examiner

TRANSISTOR ARRAY PANEL AND MANUFACTURING METHOD THEREOF

CROSS-REFERENCE TO RELATED APPLICATION

This application claims priority to and the benefit of Korean Patent Application No. 10-2017-0009161 filed in the Korean Intellectual Property Office on Jan. 19, 2017, the entire contents of which are incorporated herein by reference.

BACKGROUND

(a) Technical Field

This disclosure relates to a transistor array panel and a manufacturing method thereof.

(b) Description of the Related Art

A transistor included in various electronic devices such as a display device includes a gate electrode, a source electrode, a drain electrode, and a semiconductor layer. The transistor is used as a switching element, a driving element, and the like in the display device. A transistor array panel in the transistor is used as a circuit board to drive pixels in the display device. The transistor array panel may include a gate line transmitting a gate signal and a data line transmitting a data voltage corresponding to an image signal, and may include a pixel electrode connected to the transistor.

To meet a demand for a high-resolution display device, a method of reducing a plane size of the transistor may be considered. In general, the transistor used in the display device has a channel region that is formed to be substantially parallel to the substrate plane surface. Also, a source electrode and a drain electrode of the transistor are formed to not overlap each other or the channel region on a plane. Accordingly, there are many limitations to reduce the size on the plane of the transistor.

There is a vertical type of transistor in which the channel region is formed to be substantially perpendicular to the plane of the substrate. Because the source electrode and the drain electrode overlap each other in the vertical type of transistor such that the plane size may be reduced compared to the conventional transistor, it may be used in the high-resolution display device. However, when forming transistors having different channel lengths on one substrate, the vertical type of transistor may require a complicated process compared to the conventional transistors.

The above information disclosed in this Background section is only for enhancement of understanding of the background, and therefore it may contain information that does not form the prior art that is already known in this country to a person of ordinary skill in the art.

SUMMARY

Exemplary embodiments provide a transistor array panel including a vertical type of transistors having different channel lengths, and a manufacturing method thereof.

A transistor array panel according to an exemplary embodiment includes a substrate, and a first transistor and a second transistor positioned on the substrate. Each of the first transistor and the second transistor includes: a first electrode; a second electrode overlapping the first electrode; a spacing member positioned between the first electrode and the second electrode; a semiconductor layer extending along a side wall of the spacing member; and a gate electrode overlapping the semiconductor layer. A thickness of the spacing member of the first transistor is larger than a thickness of the spacing member of the second transistor.

The spacing member of the first transistor may include a first insulator, a second insulator, and a floating electrode between the first insulator and the second insulator, and the spacing member of the second transistor may include the first insulator.

The first insulator of the first transistor may be positioned at the same layer as the first insulator of the second transistor, and the floating electrode of the first transistor may be positioned at the same layer as the second electrode of the second transistor.

The semiconductor layer of the first transistor may be positioned at the same layer as the semiconductor layer of the second transistor.

The semiconductor layer of the first transistor may include a first portion and a second portion respectively overlapping the first electrode and the second electrode of the first transistor in a direction parallel to a plane surface of the substrate, and a channel region between the first portion and the second portion of the first transistor. The semiconductor layer of the second transistor may include a first portion and a second portion respectively overlapping the first electrode and the second electrode of the second transistor in the direction parallel to the plane surface of the substrate, and a channel region between the first portion and the second portion of the second transistor. A length of the channel region of the first transistor may be larger than a length of the channel region of the second transistor.

An interval between the first electrode and the second electrode of the first transistor may be larger than an interval between the first electrode and the second electrode of the second transistor.

The transistor array panel may further include a buffer layer positioned between the substrate and the first and second transistors. The buffer layer may include a first region overlapping the first electrodes of the first and second transistors and having a first thickness, and a second region that does not overlap the first electrodes of the first and second transistors and having a second thickness that is smaller than the first thickness.

The first insulator, the floating electrode, the second insulator, and the second electrode of the first transistor may have substantially the same plane shape, and edges thereof may be substantially matched.

The semiconductor layer, the gate insulating layer, and the gate electrode of the first transistor may have substantially the same plane shape, and edges thereof may be substantially matched. The semiconductor layer, the gate insulating layer, and the gate electrode of the second transistor may have substantially the same plane shape, and edges thereof may be substantially matched.

The edge of the floating electrode of the first transistor may be positioned inside the edge of the first insulator of the first transistor. The edge of the second electrode of the second transistor may be positioned inside the edge of the first insulator of the second transistor.

The transistor array panel may further include a pixel electrode connected to the second electrode of the first transistor.

A manufacturing method of a transistor array panel according to an exemplary embodiment includes: forming and patterning a first conductive layer on a substrate to form a first electrode of a first transistor and a first electrode of a second transistor; sequentially forming a first insulating layer covering the first electrodes, a second conductive layer, a second insulating layer, and a third conductive layer; patterning the first insulating layer, the second conductive layer, the second insulating layer, and the third conductive layer to form a spacing member and a second electrode of the first transistor and a spacing member and a second electrode of the second transistor, wherein the spacing member of the first transistor is thicker than the spacing member of the second transistor; and forming a semiconductor layer and a gate electrode of the first transistor and a semiconductor layer and a gate electrode of the second transistor.

The spacing member of the first transistor may include a first insulator formed from the first insulating layer, a floating electrode formed from the second conductive layer, and a second insulator formed from the second insulating layer. The spacing member of the second transistor may include a first insulator formed from the first insulating layer.

The second electrode of the first transistor may be formed from the third conductive layer, and the second electrode of the second transistor maybe formed from the second conductive layer.

The patterning of the first insulating layer, the second conductive layer, the second insulating layer, and the third conductive layer may include: forming a first photosensitive film pattern including a first portion and a second portion having different thicknesses on the second insulating layer; etching the third conductive layer by using the first photosensitive film pattern as a mask to form a third conductive layer pattern; etching the second insulating layer by using the first photosensitive film pattern as a mask to form a second insulating layer pattern; etching the second conductive layer by using the first photosensitive film pattern as a mask to form the floating electrode of the first transistor and the second electrode of the second transistor; and etching the first insulating layer by using the first photosensitive film pattern as a mask to form the first insulator of the first transistor and the first insulator of the second transistor.

Dry etching may be used when etching the third conductive layer, the second insulating layer, and the first insulating layer, and wet etching may be used when etching the second conductive layer.

The patterning of the first insulating layer, the second conductive layer, the second insulating layer, and the third conductive layer may further include: patterning the first photosensitive film pattern by an etch-back method to form a secondary photosensitive film pattern; and etching the third conductive layer pattern and the second insulating layer pattern by using the secondary photosensitive film pattern as a mask to form the second electrode and the second insulator of the first transistor.

Dry etching may be used when etching the third conductive layer pattern and the second insulating layer pattern.

The forming of the semiconductor layers and the gate electrodes of the first and second transistors may include: sequentially depositing a semiconductor layer, a third insulating layer, and a fourth conductive layer; etching the fourth conductive layer to form the gate electrodes of the first and second transistors; etching the third insulating layer to form gate insulating layers of the first and second transistors; and etching the semiconductor layer to form the semiconductor layers of the first and second transistors.

The method may further include: forming a planarization layer covering the first and second transistors; and forming a pixel electrode connected to the second electrode of the first transistor.

According to the exemplary embodiments, the transistor array panel including the vertical type of transistors having the different channel lengths may be provided. Also, the channel lengths of the vertical type of transistors may be formed to be differentiated by using one mask.

DETAILED DESCRIPTION OF THE EMBODIMENTS

Figure 1:
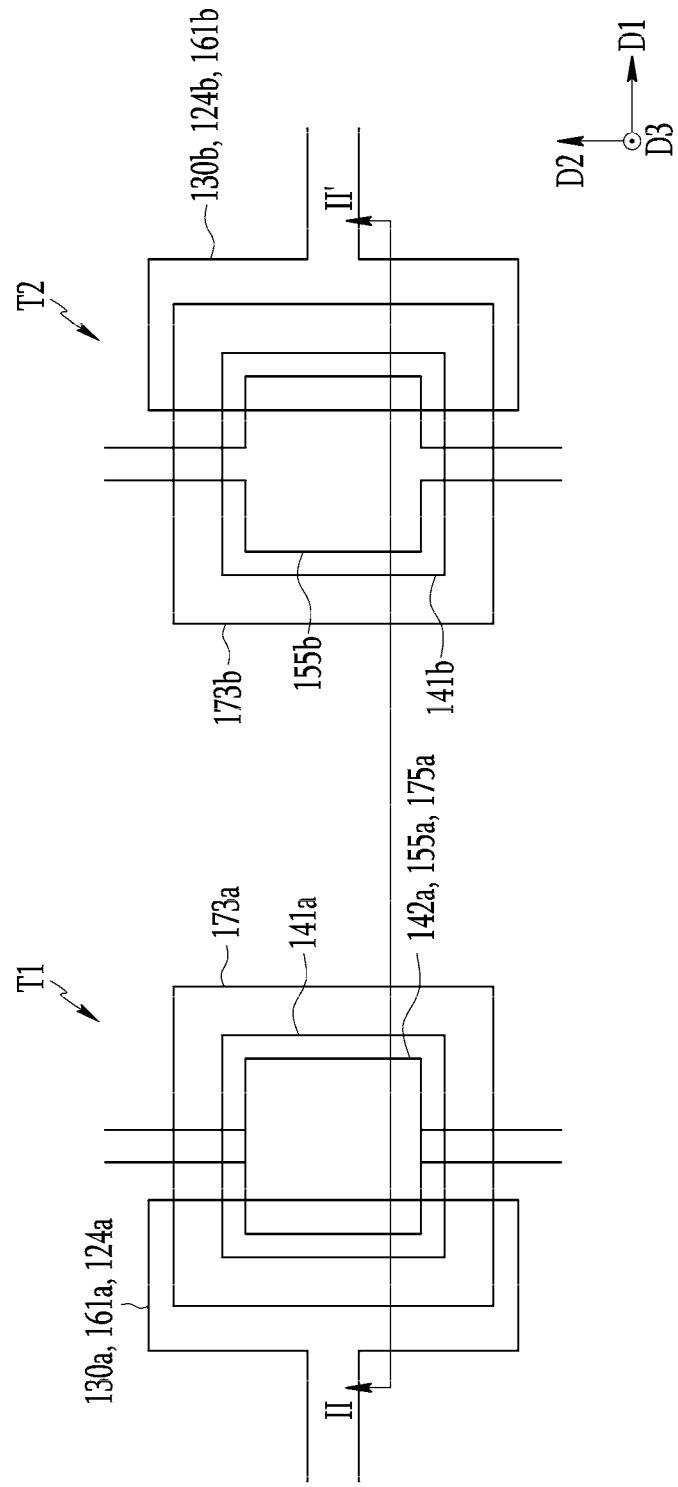
FIG. 1 is a schematic top plan view of a transistor array panel according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Like reference numerals designate like elements throughout the specification. In the drawings, the thickness or sizes of respective layers and areas may be enlarged or reduced to clearly illustrate their arrangements and relative positions.

It will be understood that when an element such as a layer, film, region, or substrate is referred to as being "on" another element, it may be directly on the other element or intervening elements may also be present. In contrast, when an element is referred to as being "directly on" another element, there are no intervening elements present.

In addition, unless explicitly described to the contrary, the word "comprise" and variations such as "comprises" or "comprising" will be understood to imply the inclusion of stated elements but not the exclusion of any other elements.

Further, in this specification, the phrase "on a plane" means viewing a target portion from the top, and the phrase "on a cross-section" means viewing a cross-section formed by vertically cutting a target portion from the side.

A transistor array panel according to an exemplary embodiment of the present invention will now be described in detail with reference to accompanying drawings.

Figure 2:
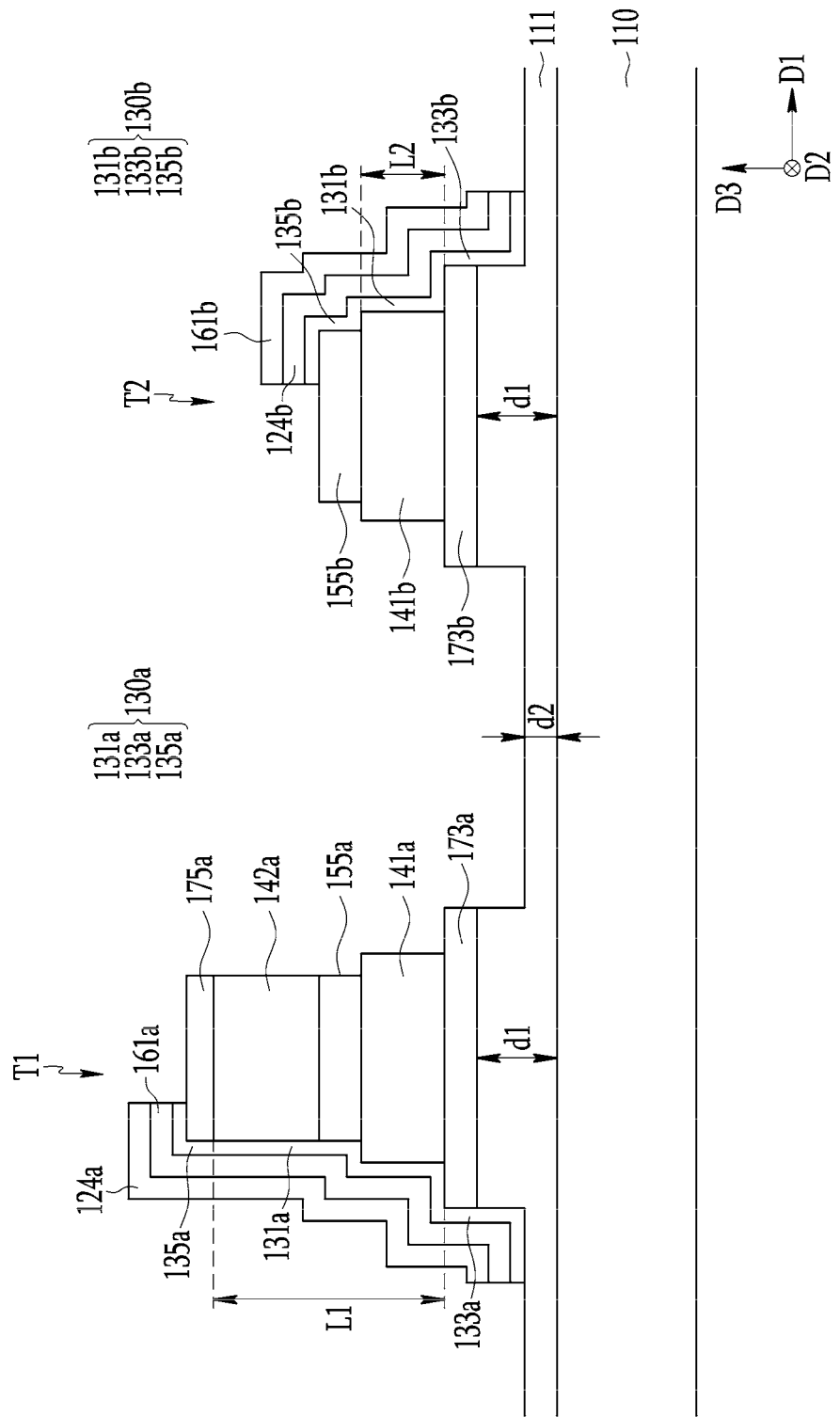
FIG. 2 is a schematic cross-sectional view taken along a line II-II' in FIG. 1.

FIG. 1 is a schematic top plan view of a transistor array panel according to an exemplary embodiment, and FIG. 2 is a schematic cross-sectional view taken along a line II-II' in FIG. 1.

Referring to FIG. 1 and FIG. 2, a transistor array panel includes a substrate 110, and a first transistor T1 and a second transistor T2 formed thereon. The first transistor T1 has a first channel length L1, and the second transistor T2 has a second channel length L2 that is shorter than the first channel length L1. Although not shown, the transistor array panel may include a pixel electrode connected to the first transistor T1, the second transistor T2, or another transistor.

The first transistor T1 includes a first electrode 173a, a second electrode 175a, a gate electrode 124a, and a semiconductor layer 130a. A first insulator 141a, a floating electrode 155a, and a second insulator 142a are positioned between the first electrode 173a and the second electrode 175a. The first electrode 173a, the first insulator 141a, the floating electrode 155a, the second insulator 142a, and the second electrode 175a are sequentially deposited on the substrate 110. A gate insulating layer 161a is positioned between the semiconductor layer 130a and the gate electrode 124a.

One of the first electrode 173a and the second electrode 175a is a source electrode, and the other is a drain electrode. For example, the first electrode 173a may be the source electrode and the second electrode 175a may be the drain electrode, or vice versa. The first transistor T1 includes the first insulator 141a, the floating electrode 155a, and the second insulator 142a as a spacing member between the first electrode 173a and the second electrode 175a. The semiconductor layer 130a is formed to be substantially perpendicular to the plane surface of the substrate 110 along a sidewall of the first insulator 141a, the floating electrode 155a, and the second insulator 142a (e.g., formed along a direction D3, which is perpendicular to the plane surface formed by directions D1 and D2, such as shown in FIG. 2). The semiconductor layer 130a includes a first portion 133a overlapping the first electrode 173a in a direction D1 parallel to the plane surface of the substrate 110, a second portion 135a overlapping the second electrode 175a, and a channel region 131a between the first portion 133a and the second portion 135a. The length of the channel region 131a corresponds to the channel length L1 of the first transistor T1, and may be the about the same as an interval between the first electrode 173a and the second electrode 175a. The gate insulating layer 161a and the gate electrode 124a are sequentially deposited on the semiconductor layer 130a.

The second transistor T2 includes a first electrode 173b, a second electrode 155b, a gate electrode 124b, and a semiconductor layer 130b. A first insulator 141b is positioned between the first electrode 173b and the second electrode 155b. The first electrode 173b, the first insulator 141b, and the second electrode 155b are sequentially deposited on the substrate 110. One of the first electrode 173b and the second electrode 155b is the source electrode, and the other is the drain electrode. For example, the first electrode 173b may be the source electrode and the second electrode 155b may be the drain electrode, or vice versa. The second transistor T2 includes the first insulator 141b as the spacing member between the first electrode 173b and the second electrode 155b. The semiconductor layer 130b is formed to be substantially perpendicular to the plane surface of the substrate 110 along the sidewall of the first insulator 141b. The semiconductor layer 130b includes a first portion 133b overlapping the first electrode 173b in the direction D1 parallel to the plane surface of the substrate 110 and a second portion 135b overlapping the second electrode 155b, and includes a channel region 131b between the first portion 133b and the second portion 135b. The length of the channel region 131b corresponds to the channel length L2 of the second transistor T2, and may be the about the same as an interval between the first electrode 173b and the second electrode 155b. A gate insulating layer 161b and the gate electrode 124b are sequentially deposited on the semiconductor layer 130b.

While the second transistor T2 includes only one insulator 141b between the first electrode 173a and the second electrode 175a, the first transistor T1 includes two insulators 141a and 142a between the first electrode 173b and the second electrode 155b, and further includes the floating electrode 155a between these insulators 141a and 142a. Accordingly, the first channel length L1 may be longer than the second channel length L2 by about the thickness of the floating electrode 155a and the second insulator 142a. The second electrode 155b of the second transistor T2 may be positioned directly on the first insulator 141b.

In the drawing, the channel regions 131a and 131b of the first and second transistors T1 and T2 are perpendicular to the plane surface of the substrate 110; however, it is not limited thereto, and the channel regions 131a and 131b may be formed to be inclined with respect to the plane surface of the substrate 110 by a predetermined angle. The first and second transistors T1 and T2 and the constituent elements of these transistors are approximately quadrangular; however, they may have various plane shapes such as polygonal, circular, elliptical, etc.

The source electrode and the drain electrode of the first transistor T1 may be determined by the direction of a carrier flowing through the channel region 131a of the semiconductor layer 130a when applying a gate-on voltage to the gate electrode 124a, and the carrier flows from the source electrode to the drain electrode. Accordingly, during the operation of the first transistor T1, in an n-type transistor, an electron flows from the source electrode to the drain electrode, while in a p-type transistor, a hole flows from the source electrode to the drain electrode. The relationship of the source electrode and the drain electrode of the second transistor T2 is the same as that of the first transistor T1.

Next, the constituent elements and the layers configuring the transistor array panel will be described in further detail.

The substrate 110 made of an insulating material such as glass, plastic, etc. The substrate 110 may be optically transparent.

A buffer layer 111 covering the substrate 110 may be positioned on the substrate 110. The buffer layer 111 may include an inorganic insulating material such as a silicon oxide (SiOx), a silicon nitride (SiNx), aluminum oxide ($Al_2O_3$), hafnium oxide ($HfO_3$), and yttrium oxide ($Y_2O_3$). The buffer layer 111 may be a single layer or a multilayer. For example, when the buffer layer 120 is a double layer, a lower layer thereof may include a silicon nitride and an upper layer thereof may include a silicon oxide. The buffer layer 111 may be used to prevent an impurity degrading a characteristic of a semiconductor from being diffused and moisture from penetrating. The buffer layer 111 may have a first thickness d1 at a region overlapping the first electrodes 173a and 173b and a second thickness d2 at a region that does overlap, and the second thickness d2 may be smaller than the first thickness d1.

The first electrode 173a of the first transistor T1 and the first electrode 173b of the second transistor T2 are positioned on the buffer layer 111. The first electrode 173a and the first electrode 173b may be positioned at the same layer, and may substantially have the same thickness. Here, "the same layer" may mean a layer that is simultaneously formed of the same material in one deposition process. The first electrodes 173a and 173b may be approximately quadrangular on a plane surface; however, they are not limited thereto and, for example, may be approximately circular. The first electrodes 173a and 173b may include a metal such as copper, aluminum, silver, molybdenum, chromium, tantalum, titanium, tungsten, nickel, and metal alloys thereof, and may be the single layer or the multilayer.

The first insulator 141a of the first transistor T1 is positioned on the first electrode 173a, and the first insulator 141b of the second transistor T2 is positioned on the first electrode 173b. The first insulator 141a and the first insulator 141b may be positioned at the same layer in the transistor array panel and may have substantially the same thickness. The first insulator 141a and the first insulator 141b may be approximately quadrangular on a plane surface; however, they are not limited thereto and, for example, may be approximately circular. The plane area of the first insulator 141a may be smaller than that of the first electrode 173a, and the edge of the first insulator 141a may be positioned inside the edge of the first electrode 173a. The first insulators 141a and 141b may include an inorganic insulating material such as a silicon oxide and a silicon nitride, or may include the organic insulating material.

The floating electrode 155a of the first transistor T1 is positioned on the first insulator 141a, and the second electrode 155b of the second transistor T2 is positioned on the first insulator 141b. The floating electrode 155a and the second electrode 155b may be positioned at the same layer in the transistor array panel and may have substantially the same thickness. The plane area of the floating electrode 155a may be smaller than that of the first insulator 141a, and the edge of the floating electrode 155a may be positioned inside the edge of the first insulator 141a. The second electrode 155b may have substantially the same plane shape as the first insulator 141b, and the edge of the second electrode 155b may substantially match the edge of the first insulator 141b. The plane area of the second electrode 155b may be smaller than that of the first insulator 141b, and the edge of the second electrode 155b may be positioned inside the edge of the first insulator 141b. The floating electrode 155a and the second electrode 155b may include metal such as copper, aluminum, silver, molybdenum, chromium, tantalum, titanium, tungsten, chromium, or metal alloys thereof, and may be a single layer or a multilayer. The floating electrode 155a is formed of a conductor like the second electrode 155b but is in an electrically floating state (e.g., electrically isolated from other metal elements).

The second insulator 142a and the second electrode 175a of the first transistor T1 are sequentially positioned on the floating electrode 155a. The second insulator 142a and the second electrode 175a may have substantially the same plane shape as the floating electrode 155a, and the edges of the second insulator 142a and the second electrode 175a may substantially match the edge of the floating electrode 155a. The second insulator 142a may include an inorganic insulating material such as a silicon oxide and a silicon nitride, or may include an organic insulating material. The second electrode 175a may include metal such as copper, aluminum, silver, molybdenum, chromium, tantalum, titanium, tungsten, chromium, or metal alloys thereof, and may be a single layer or a multilayer. The second electrode 175a may be formed of a different material from or the same material as the first electrode 173a and/or the floating electrode 155a.

The semiconductor layer 130a of the first transistor T1 is positioned on the second electrode 175a, and the semiconductor layer 130b of the second transistor T2 is positioned on the second electrode 155b. The semiconductor layer 130a extends downward along the sidewalls of the second insulator 142a, the floating electrode 155a, and the first insulator 141a as the spacing member, and the semiconductor layer 130b extends downward along the sidewall of the first insulator 141b as the spacing member. One end of the semiconductor layer 130a may be positioned directly on the second electrode 175a, and the other end thereof may be positioned directly on the buffer layer 111. One end of the semiconductor layer 130b may be positioned directly on the second electrode 155b, and the other end thereof may be positioned directly on the buffer layer 111.

The semiconductor layer 130a includes the channel region 131a overlapping the first insulator 141a, the floating electrode 155a, and the second insulator 142a in the direction D1 parallel to the plane surface of the substrate 110. The semiconductor layer 130b includes the channel region 131b overlapping the first insulator 141b in the direction D1 parallel to the plane surface of the substrate 110. Accordingly, a channel length L1 of the first transistor T1 corresponding to a length of the channel region 131a is larger than a channel length L2 of the second transistor T2 corresponding to the length of the channel region 131b by a length corresponding to the thickness of the floating electrode 155a and the second insulator 142a. The semiconductor layer 130a includes the first portion 133a and the second portion 135a respectively below and above the channel region 131a along the direction D3. The first portion 133a contacts the first electrode 173a, and the second portion 135a contacts the second electrode 175a. The semiconductor layer 130b includes the first portion 133b and the second portion 135b respectively below and above the channel region 131b along the direction D3. The first portion 133b may contact the first electrode 173b, and the second portion 135b may contact the second electrode 155b.

The semiconductor layers 130a and 130b may include a metal oxide, amorphous silicon, polysilicon, etc. For example, the metal oxide may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The gate insulating layer 161a and the gate electrode 124a of the first transistor T1 are sequentially positioned on the semiconductor layer 130a. The gate insulating layer 161b and the gate electrode 124b of the second transistor T2 are sequentially formed on the semiconductor layer 130b. The gate insulating layers 161a and 161b may be positioned at the same layer as each other in the transistor array panel, and the gate electrodes 124a and 124b may be positioned at the same layer as each other in the transistor array panel. The gate insulating layer 161a, the gate electrode 124a, and the semiconductor layer 130a may have substantially the same plane shape, and the edges of the gate insulating layer 161a, the gate electrode 124a, and the semiconductor layer 130a may be substantially matched. The gate insulating layer 161b, the gate electrode 124b, and the semiconductor layer 130b may have substantially the same plane shape, and the edges of the gate insulating layer 161b, the gate electrode 124b, and the semiconductor layer 130b may be substantially matched. The gate insulating layers 161a and 161b may include an inorganic insulating material such as a silicon nitride, a silicon oxide, etc. The gate electrodes 124a and 124b may include metal such as molybdenum, aluminum, copper, silver, chromium, tantalum, titanium, or metal alloys thereof, and may be a single layer or a multilayer.

The first transistor T1 and the second transistor T2 having the above-described structure may be respectively used as a driving transistor and a switching transistor in a pixel circuit of an organic light emitting device, for example. For the switching transistor, for example, it is advantageous for the channel length to be relatively short for a fast driving speed. For the driving transistor, however, it may be advantageous to have a relatively long channel length, for example, to reduce a luminance deviation due to a gate voltage distribution.

Until now, the transistor array panel according to an exemplary embodiment was described with reference to FIG. 1 and FIG. 2. Next, a method for manufacturing this transistor array panel will be described with reference to FIG. 3 to FIG. 8.

FIG. 3 to FIG. 8 are process cross-sectional views showing a manufacturing method of a transistor array panel according to an exemplary embodiment.

Figure 3:
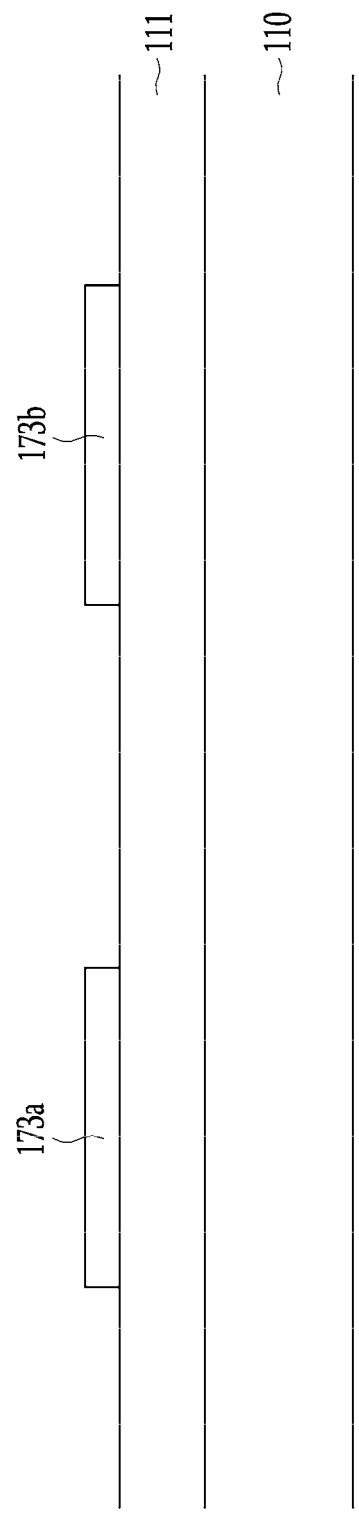
FIGS. 3, 4, 5, 6, 7 and 8 are process cross-sectional views showing a manufacturing method of a transistor array panel according to an exemplary embodiment.

Referring to FIG. 3, an inorganic insulating material such as silicon oxide, silicon nitride, aluminum oxide, hafnium oxide, and yttrium oxide is deposited on a substrate 110 through chemical vapor deposition (CVD) to form a buffer layer 111. Next, a conductive material such as a metal is deposited on the buffer layer 111 by sputtering to form a first conductive layer (not shown), and is patterned by using a photosensitive film (not shown) formed of a photosensitive material such as a photoresist and a first mask (not shown) to form a first electrode 173a of a first transistor T1 and a first electrode 173b of a second transistor T2.

Figure 4:
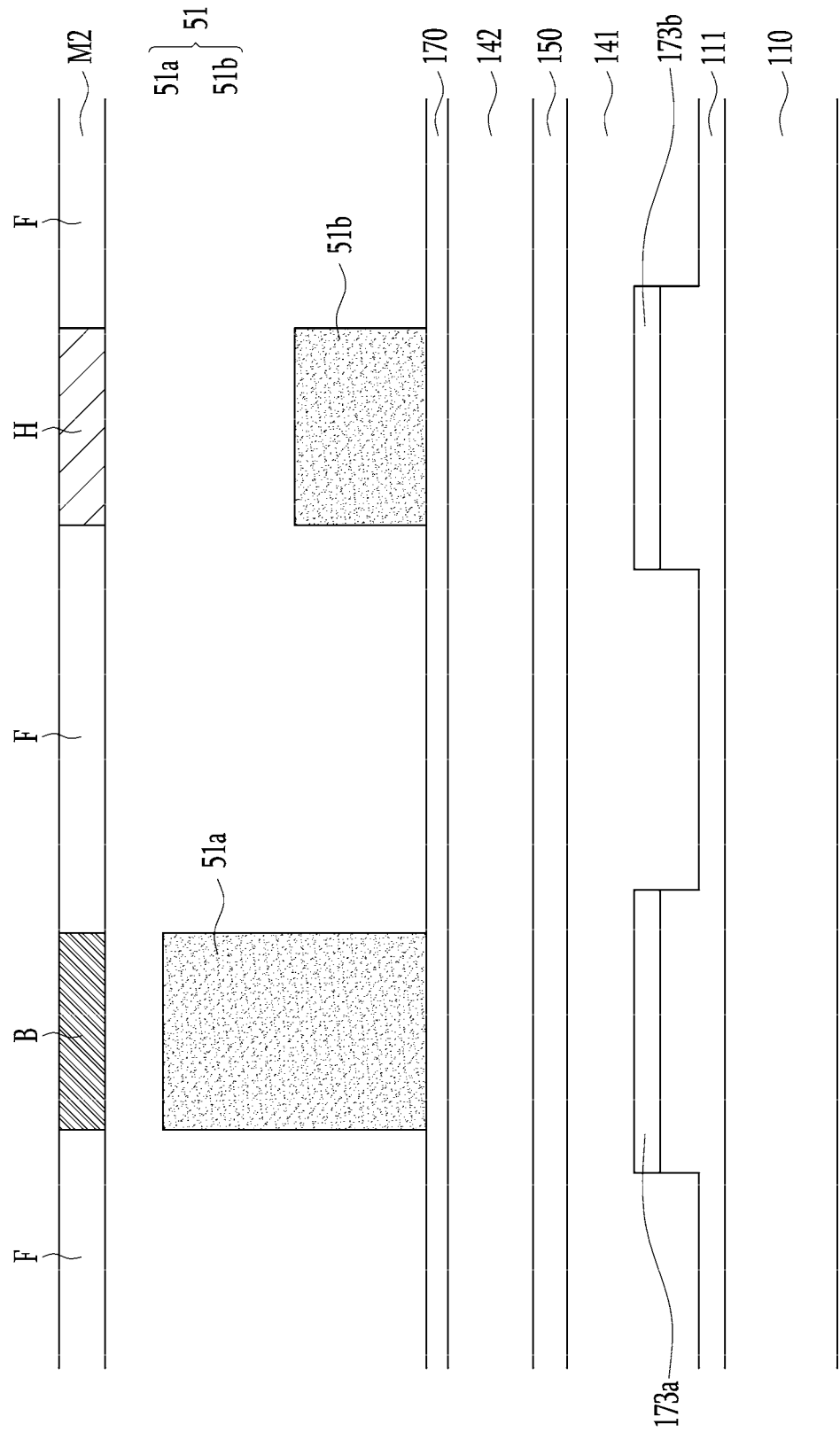

Referring to FIG. 4, a first insulating layer 141, a second conductive layer 150, a second insulating layer 142, and a third conductive layer 170 are sequentially deposited on the substrate 110 including the first electrodes 173a and 173b. The first insulating layer 141 and the second insulating layer 142 may be respectively formed by depositing an inorganic insulating material, and the second conductive layer 150 and the third conductive layer 170 may be respectively formed by depositing a conductive material such as metal. At least one of the first insulating layer 141 and the second insulating layer 142 may include an organic insulating material.

Next, a photosensitive film (not shown) is formed on the third conductive layer 170 and is patterned by using a second mask M2 to form a first photosensitive film pattern 51. The first photosensitive film pattern 51 has a first portion 51a that is relatively thick and a second portion 51b that is relatively thin. A thickness difference of the first photosensitive film pattern 51 may be formed by using a second mask M2, for example, including a transmissive region F where light passes completely, a transflective region H where only a part of the light passes, and a blocking region B where the light is blocked completely. In the case of a photosensitive material having positive photosensitivity in which a portion irradiated with light is removed, the first portion 51a of the first photosensitive film pattern 51 may be a portion corresponding to the blocking region B of the second mask M2, and the second portion 51b may be a portion exposed by corresponding to the transflective region H of the second mask M2. The portion where the first photosensitive film pattern 51 is not formed as the photosensitive material is completely removed may be an exposed portion corresponding to the complete transmissive region F of the second mask M2. In a case that the photosensitive material has negative photosensitivity, transparency of the second mask M2 corresponding to the first photosensitive film pattern 51 may be reversed. The second mask M2 may be a half-tone mask. However, the first photosensitive film pattern 51 as shown may also be formed by using a slit mask including a slit pattern or a lattice pattern as well as the half-tone mask.

Figure 5:
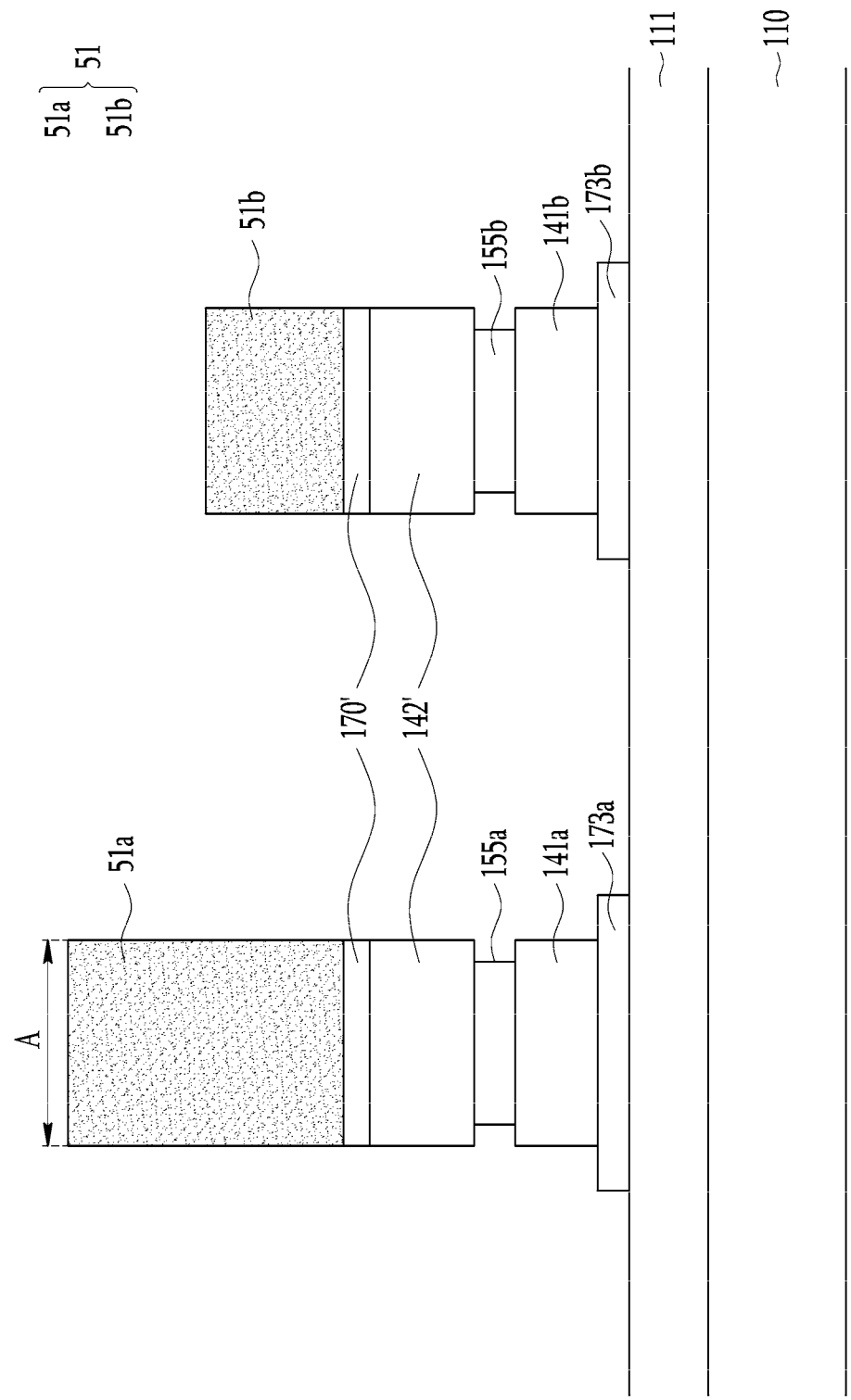

Referring to FIG. 4 and FIG. 5, the third conductive layer 170, the second insulating layer 142, the second conductive layer 150, and the first insulating layer 141 are sequentially patterned by using the first photosensitive film pattern 51 as a mask. In detail, the third conductive layer 170 is etched to form a third conductive layer pattern 170', the second insulating layer 142 is etched to form a second insulating layer pattern 142', the second conductive layer 150 is etched to form a floating electrode 155a of the first transistor T1 and a second electrode 155b of the second transistor T2, and the first insulating layer 141 is etched to form a first insulator 141a of the first transistor T1 and a first insulator 141b of the second transistor T2. Dry etching may be used in the etching of the third conductive layer 170, the second insulating layer 142, and the first insulating layer 141, and wet etching may be used in the etching of the second conductive layer 150. Alternatively, the wet etching may be used when etching the third conductive layer 170, the second insulating layer 142, and/or the first insulating layer 141, and the dry etching may be used when etching the second conductive layer 150.

Although four layers are etched by using one photosensitive film pattern 51 as the mask, the edges of the third conductive layer pattern 170', the second insulating layer pattern 142', and the first insulators 141a and 141b formed by the dry etching may be substantially matched with the edge of the first photosensitive film pattern 51, whereas the edges of the floating electrode 155a and the second electrode 155b formed by the wet etching may be positioned inside the edge of the first photosensitive film pattern 51 due to an isotropic etching characteristic of an etchant. Because a metal such as copper may be relatively more difficult to etch by the dry etching, the third conductive layer 170 may include a metal such as aluminum, molybdenum, or titanium rather than copper, for example. In contrast, the second conductive layer 150 etched by the wet etching may include copper as well as a metal such as aluminum, molybdenum, and titanium.

Figure 6:
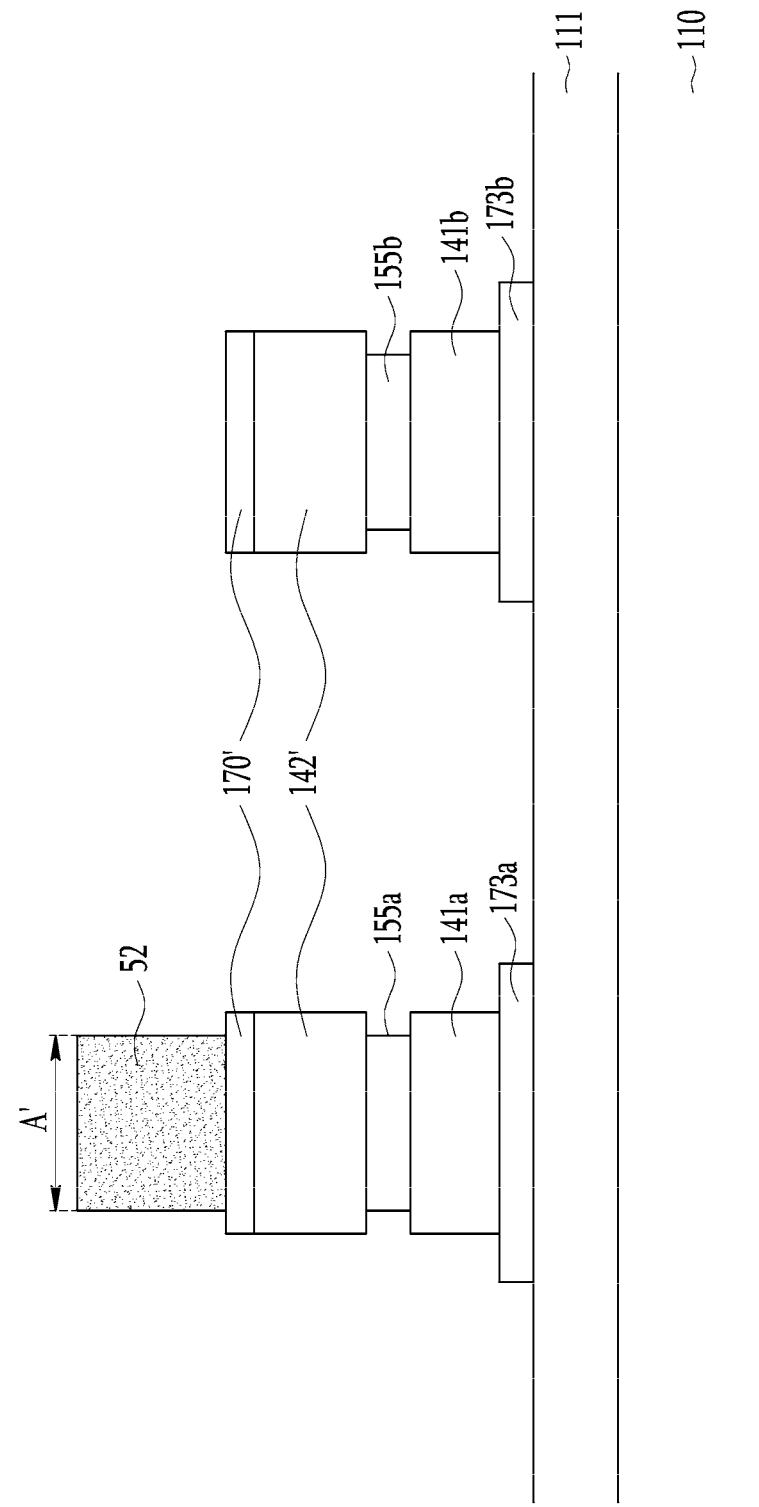

Referring to FIG. 6, the second portion 51b that is the thin portion of the first photosensitive film pattern 51 is removed by an-etch back process. In this case, the first portion 51a may also be etched such that a width and a height thereof are reduced, and thereby a secondary photosensitive film pattern 52 is formed. The secondary photosensitive film pattern 52 is formed in a region A' that is narrower than the region A where the first portion 51a of the first photosensitive film pattern 51 is formed.

Figure 7:
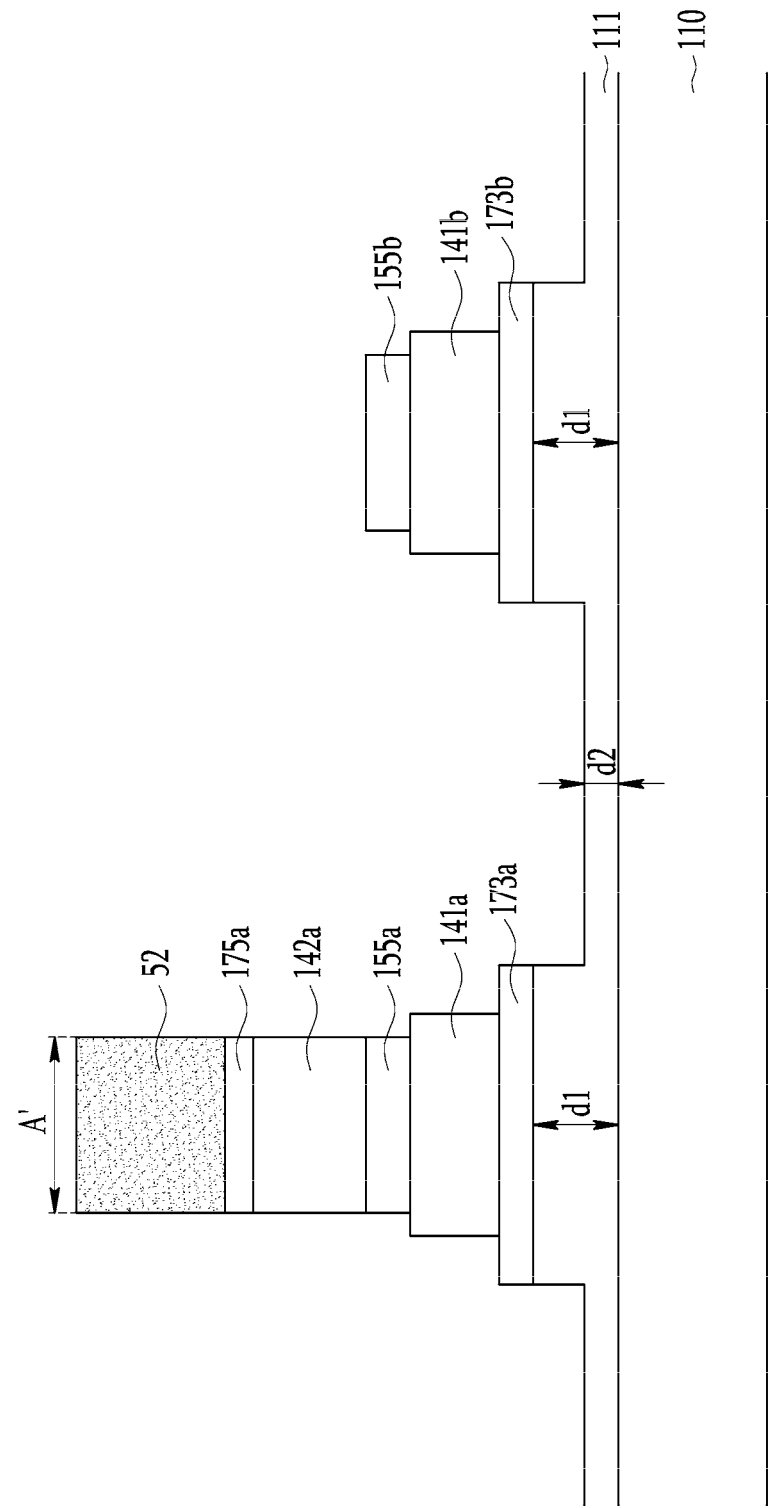

Referring to FIG. 6 and FIG. 7, the third conductive layer pattern 170' and the second insulating layer pattern 142' are etched by using the secondary photosensitive film pattern 51 as a mask to form a second electrode 175a and a second insulator 142a of the first transistor T1. Dry etching may be used in the etching of the third conductive layer pattern 170' and the second insulating layer pattern 142'. When etching the third conductive layer pattern 170' and the second insulating layer pattern 142', the third conductive layer pattern 170' and the second insulating layer pattern 142' disposed on the second electrode 155b of the second transistor T2 are completely removed. In this case, the second electrode 155b may have a function of a blocking layer. When etching the second insulating layer pattern 142', the surface of the regions of the buffer layer 111 that is not covered by the first electrodes 173a and 173b may be etched. Accordingly, the buffer layer 111 may include a region that is covered by the first electrodes 173a and 173b and has the first thickness d1 and a region that is not covered by the first electrodes 173a and 173b and has a second thickness d2 that is smaller than the first thickness d1.

Figure 8:
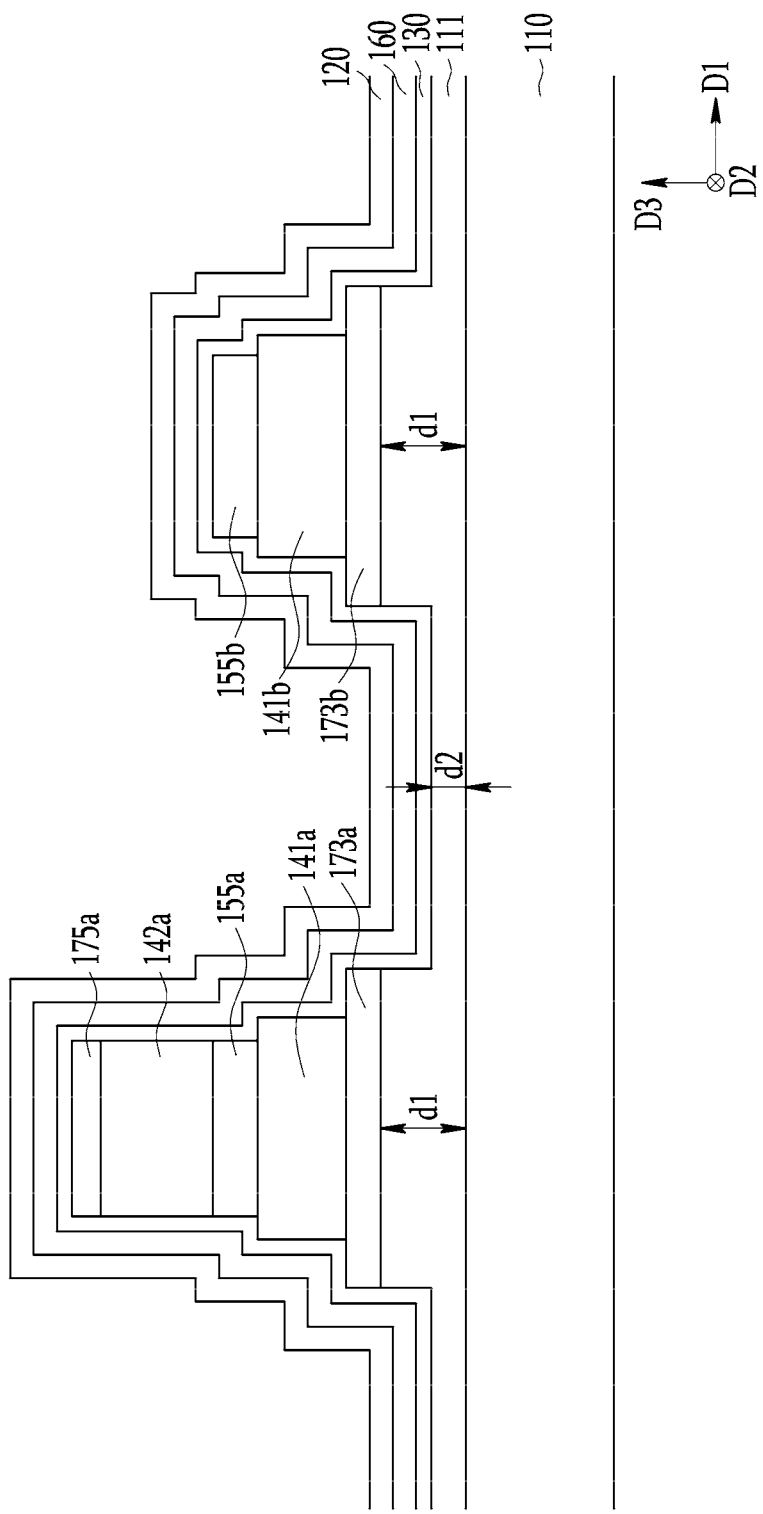

Referring to FIG. 8, a semiconductor layer 130, a third insulating layer 160, and a fourth conductive layer 120 are sequentially deposited on the substrate 110 having the second electrodes 175a and 155b. The semiconductor layer 130 may be formed of a semiconductor material including a metal oxide, a amorphous silicon, the polysilicon, and the like, the third insulating layer 160 may be formed of an inorganic insulating material, and the fourth conductive layer 120 may be formed of a conductive material such as metal, etc. Next, the fourth conductive layer 120, the third insulating layer 160, and the semiconductor layer 130 are etched by using a photosensitive film (not shown) and a third mask (not shown) to form a gate electrode 124a, a gate insulating layer 161a, and a semiconductor layer 130a of the first transistor T1 shown in FIG. 2, and to form a gate electrode 124b, a gate insulating layer 161b, and a semiconductor layer 130b of the second transistor T2. In detail, the fourth conductive layer 120 is etched to form the gate electrodes 124a and 124b, the third insulating layer 160 is etched to form the gate insulating layers 161a and 161b, and the semiconductor layer 130 is etched to form the semiconductor layers 130a and 130b. When patterning each of the fourth conductive layer 120, the third insulating layer 160, and the semiconductor layer 130, dry etching or wet etching may be used. Because one mask is used, the gate electrode 124a, the gate insulating layer 161a, and the semiconductor layer 130a of the first transistor T1 may have substantially the same plane shape, and the edges thereof may be substantially matched. Also, the gate electrode 124b, the gate insulating layer 161b, and the semiconductor layer 130b of the second transistor T2 may have substantially the same plane shape, and the edges thereof may be substantially matched.

According to the present exemplary embodiment, all three masks are used when forming two transistors T1 and T2 having the different channel lengths L1 and L2 together. Particularly, the first insulator 141a, the floating electrode 155a, the second insulator 142a, and the second electrode 175a of the first transistor T1 and the first insulator 141b and the second electrode 155b of the second transistor T2 are formed by using one mask M2. Accordingly, by using only one mask M2, the channel length L1 of the first transistor T1 corresponding to the thickness of the first insulator 141a, the floating electrode 155a, and the second insulator 142a and the channel length L2 of the second transistor T2 corresponding to the thickness of the first insulator 141b may be differentiated. Also, because the several constituent elements positioned at the different layers of the two transistors T1 and T2 are formed by using one mask M2, an alignment error of the constituent elements may be prevented such that the change of the channel length may be minimized, and a process step and a process distribution may be reduced. Also, because an overlay margin between the constituent elements of the first transistor T1 and the constituent elements of the second transistor T2 to be considered when using a plurality of masks may be ignored, a more compact design of the transistors is possible.

Next, the transistor array panel and the manufacturing method according to another exemplary embodiment of the present invention will be described with reference to FIG. 9 while focusing on differences from the above-described exemplary embodiment. The description of the same characteristics is omitted or simplified.

Figure 9:
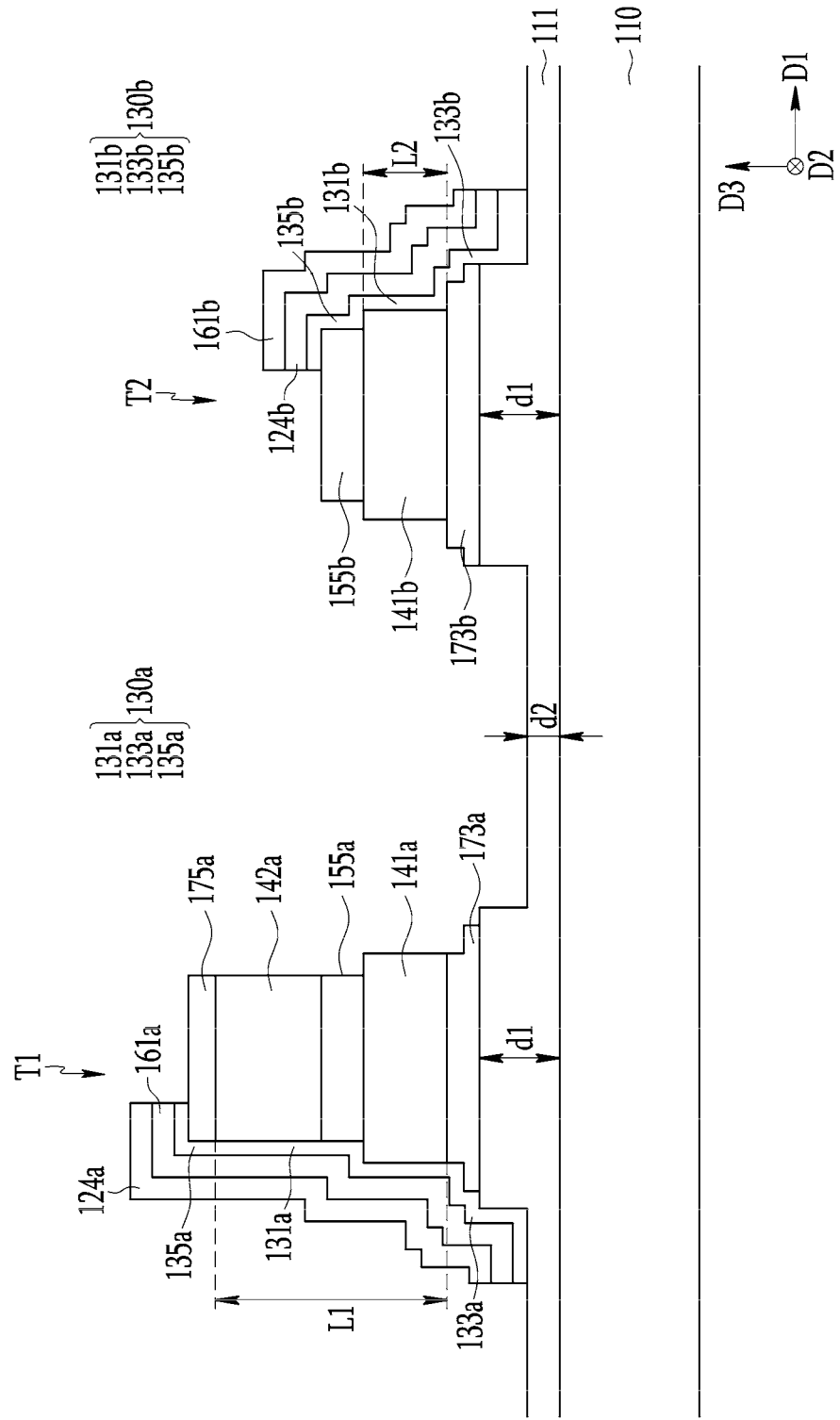
FIG. 9 is a schematic cross-sectional view of a transistor array panel according to an exemplary embodiment.

FIG. 9 is a schematic cross-sectional view of a transistor array panel according to an exemplary embodiment.

Referring to FIG. 9, the thickness of the edge portion of the first electrode 173a that does not overlap the first insulator 141a is thinner than the region of the first electrode 173a that overlaps the first insulator 141a. Similarly, the thickness of the edge portion of the second electrode 173b that does not overlap the first insulator 141b is thinner than the region of the second electrode 173b that overlaps the first insulator 141b. The stepped thickness of the first electrodes 173a and 173b may be formed according to the etching environment or the material of the conductive layer used even if the transistor array panel is manufactured by using substantially the same process steps as the manufacturing method shown in FIG. 2 to FIG. 7.

For example, in the process shown in FIG. 6 and FIG. 7, the portions of the first electrodes 173a and 173b that are not covered by the first insulators 141a and 141b, respectively, to be exposed outside may or may not be etched together according to an etch selectivity rate of a gas (dry etching) or an etchant (wet etching) used when etching the third conductive layer pattern 170' for the material of the third conductive layer pattern 170' and the material of the first electrodes 173a and 173b. The transistor array panel of FIG. 9 may correspond to a case in which the selectivity rate of the etchant is moderately high, and the transistor array panel of FIG. 2 may correspond to a case in which the selectivity rate is very high. When the selectivity rate is very low or is absent or the third conductive layer pattern 170' and the first electrodes 173a and 173b are formed of the same material, the edge portions of the first electrodes 173a and 173b that do not overlap the first insulators 141a and 141b are completely etched such that the edges of the first electrodes 173a and 173b may substantially match the edges of the first insulators 141a and 141b.

Disclosed herein is a transistor array panel that includes transistors having the different channel lengths from each other and a manufacturing method thereof. Next, a display device including the above-described transistor array panel will be described with reference to FIG. 10 and FIG. 11.

Figure 10:
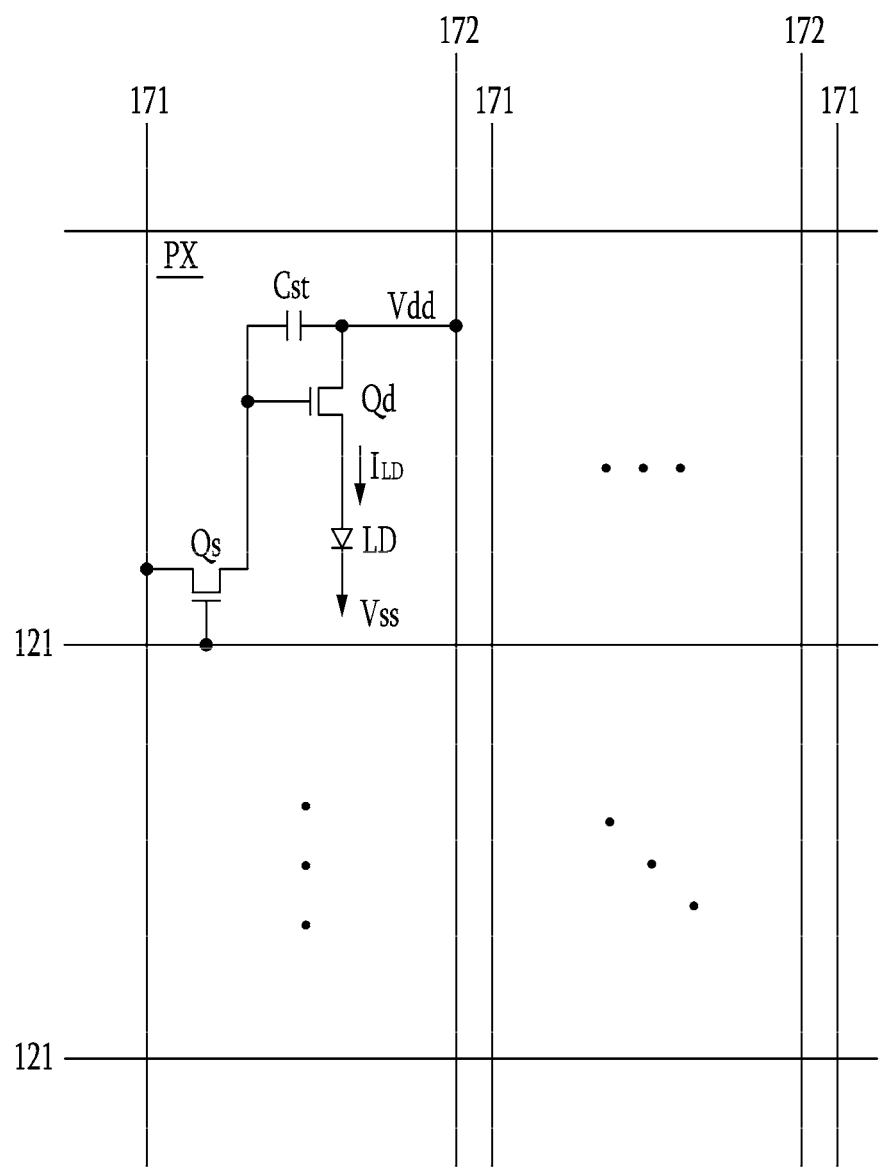
FIG. 10 is an equivalent circuit diagram of a display device including a transistor array panel according to an exemplary embodiment.
Figure 11:
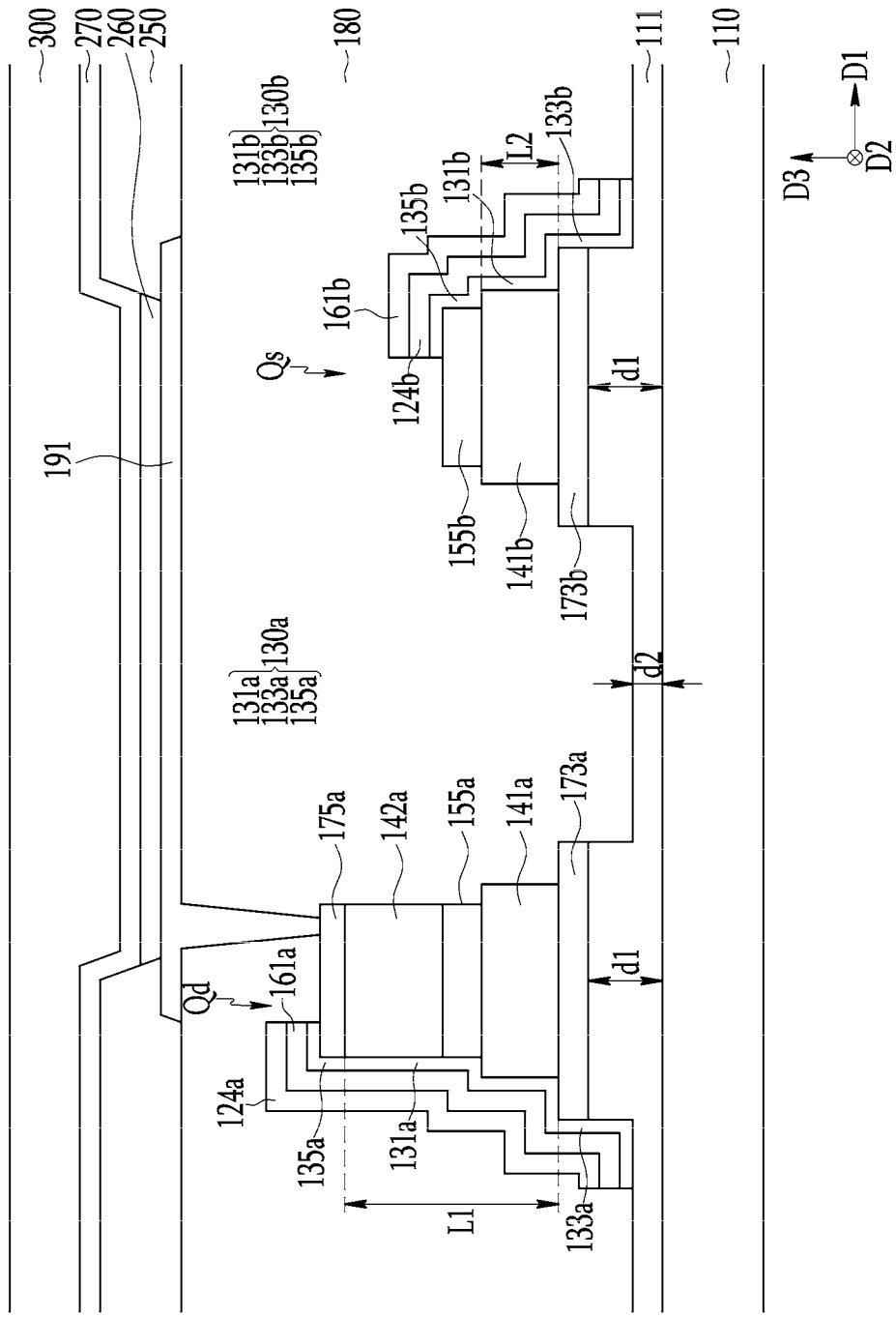
FIG. 11 is a schematic cross-sectional view of a display device including a transistor array panel according to an exemplary embodiment.

FIG. 10 is an equivalent circuit diagram of a display device including a transistor array panel according to an exemplary embodiment, and FIG. 11 is a schematic cross-sectional view of a display device including a transistor array panel according to an exemplary embodiment.

Referring to FIG. 10, a pixel circuit of an organic light-emitting device is shown. The display device includes signal lines 121, 171, and 172 and pixels PX connected thereto and arranged in an approximate matrix.

The signal lines include gate lines 121 transmitting a gate signal (referred to as a scan signal), data lines 171 transmitting a data signal, and driving voltage lines 172 transmitting a driving voltage Vdd. The gate lines 121 may approximately extend in a row direction, and the data lines 171 and the driving voltage lines 172 may approximately extend in a column direction.

Each pixel PX includes a switching transistor Qs, a driving transistor Qd, a storage capacitor Cst, and a light-emitting device LD of an organic light emitting diode. Although not shown, the pixel PX may further include a transistor and/or a capacitor to compensate a current provided to the light-emitting device LD. Also, a connection relationship of the transistors Qs and Qd, the storage capacitor Cst, and the light-emitting device LD may be variously changed.

A control terminal (the gate electrode), an input terminal (the first electrode), and an output terminal (the second electrode) of the switching transistor Qs may be connected to the gate line 121, the data line 171, and the driving transistor Qd, respectively. The switching transistor Qs may transmit the data voltage received from the data line 171 to the driving transistor Qd in response to the gate signal received from the gate line 121. The control terminal (the gate electrode), the input terminal (the first electrode), and the output terminal (second electrode) of the driving transistor Qd are respectively connected to the switching transistor Qs, the driving voltage line 172, and the light-emitting device LD. A current ($I_{LD}$) flowing through the driving transistor Qd may be controlled depending on the voltage between the control terminal and the output terminal of the driving transistor Qd. The storage capacitor Cst may be connected between the control terminal and the input terminal of the driving transistor Qd. The storage capacitor Cst charges the data voltage applied to the control terminal of the driving transistor Qd and maintains the data voltage after the switching transistor Qs is turned off, thereby maintaining a light-emission state of the light-emitting device LD until the next data voltage is applied.

The light-emitting device LD has an anode connected to the output terminal of the driving transistor Qd and a cathode connected to a ground voltage or a common voltage Vss. The light-emitting device LD may emit light by changing its intensity depending on the output current ($I_{LD}$) of the driving transistor Qd, thereby displaying an image.

Referring to FIG. 11, an example in which the light-emitting device LD shown in FIG. 10 is connected to the transistor array panel shown in FIG. 2 is provided. As described above, the driving transistor Qd of the first transistor and the switching transistor Qs of the second transistor are positioned on the substrate 110. The first transistor having the relatively long channel length L1 may be used as the driving transistor Qd, and the second transistor having the relatively short channel length L2 may be used as the switching transistor Qs.

A planarization layer of the insulating layer, also referred to as a passivation layer, is formed on the driving transistor Qd and the switching transistor Qs. The planarization layer 180 removes and planarizes a step and increases emission efficiency of the organic light-emitting element to be formed thereon.

A pixel electrode 191 is formed on the planarization layer 180. The pixel electrode 191 is connected to the second electrode 175a of the driving transistor Qd through a contact hole formed in the planarization layer 180. A pixel definition layer 250 is positioned on the planarization layer 180 and the pixel electrode 191. The pixel definition layer 250 has an opening overlapping the pixel electrode 191. The pixel definition layer 250 may include a resin such as a polyacrylic, a polyimide, and the like, or a silica-based inorganic material.

An emission layer 260 is positioned on the pixel electrode 191 in the opening of the pixel definition layer 250, and a common electrode 270 is positioned on the emission layer 260. The pixel electrode 191, the emission layer 260, and the common electrode 270 together configure the organic light-emitting diode of the light-emitting device LD. The pixel electrode 191 may be the anode of the organic light-emitting diode, and the common electrode 270 may be the cathode of the organic light-emitting diode. An encapsulation layer 300 protecting the organic light-emitting diode may be positioned on the common electrode 270.

The transistor array panel according to the exemplary embodiments of the present invention can be included in various display devices.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A transistor array panel comprising
a substrate, and a first transistor and a second transistor positioned on the substrate,
wherein each of the first transistor and the second transistor includes:
a first electrode;
a second electrode overlapping the first electrode;
a spacing member positioned between the first electrode and the second electrode;
a semiconductor layer extending along a side wall of the spacing member; and
a gate electrode overlapping the semiconductor layer,
wherein a thickness of a first portion of the spacing member of the first transistor is larger than a thickness of a second portion of the spacing member of the second transistor, the first portion overlapping with the first and second electrodes of the first transistor, and the second portion overlapping with the first and second electrodes of the second transistor, and
wherein the spacing member of the first transistor includes a first insulator, a second insulator, and a floating electrode between the first insulator and the second insulator.

2. The transistor array panel of claim 1, wherein the spacing member of the second transistor includes the first insulator.

3. The transistor array panel of claim 2, wherein:
the first insulator of the first transistor is positioned at a same layer as the first insulator of the second transistor; and
the floating electrode of the first transistor is positioned at a same layer as the second electrode of the second transistor.

4. The transistor array panel of claim 2, wherein the semiconductor layer of the first transistor is positioned at a same layer as the semiconductor layer of the second transistor.

5. The transistor array panel of claim 2, wherein the first insulator, the floating electrode, the second insulator, and the second electrode of the first transistor have substantially the same plane shape, and edges thereof are substantially matched.

6. The transistor array panel of claim 2, wherein:
the semiconductor layer, a gate insulating layer, and the gate electrode of the first transistor have substantially the same plane shape, and edges thereof are substantially matched; and
the semiconductor layer, a gate insulating layer, and the gate electrode of the second transistor have substantially the same plane shape, and edges thereof are substantially matched.

7. The transistor array panel of claim 2, wherein:
the edge of the floating electrode of the first transistor is positioned inside the edge of the first insulator of the first transistor; and
the edge of the second electrode of the second transistor is positioned inside the edge of the first insulator of the second transistor.

8. The transistor array panel of claim 1, wherein:
the semiconductor layer of the first transistor includes a first portion and a second portion respectively overlapping the first electrode and the second electrode of the first transistor in a direction parallel to a plane surface of the substrate, and a channel region between the first portion and the second portion of the first transistor;
the semiconductor layer of the second transistor includes a first portion and a second portion respectively overlapping the first electrode and the second electrode of the second transistor in the direction parallel to the plane surface of the substrate, and a channel region between the first portion and the second portion of the second transistor; and a length of the channel region of the first transistor is larger than a length of the channel region of the second transistor.

9. The transistor array panel of claim 8, wherein an interval between the first electrode and the second electrode of the first transistor is larger than an interval between the first electrode and the second electrode of the second transistor.

10. The transistor array panel of claim 1, further comprising
a pixel electrode connected to the second electrode of the first transistor.

11. A transistor array panel comprising
a substrate, and a first transistor and a second transistor positioned on the substrate,
wherein each of the first transistor and the second transistor includes:
a first electrode;
a second electrode overlapping the first electrode;
a spacing member positioned between the first electrode and the second electrode, wherein the spacing member includes a floating electrode;
a semiconductor layer extending along a side wall of the spacing member;
a gate electrode overlapping the semiconductor layer; and
a buffer layer positioned between the substrate and the first and second transistors,
wherein a thickness of a first portion of the spacing member of the first transistor is larger than a thickness of a second portion of the spacing member of the second transistor, the
first portion overlapping with the first and second electrodes of the first transistor, and the
second portion overlapping with the first and second electrodes of the second transistor, and
wherein the buffer layer includes a first region overlapping the first electrodes of the first and second transistors and having a first thickness, and a second region that does not overlap the first electrodes of the first and second transistors and having a second thickness that is smaller than the first thickness.

12. A method for manufacturing a transistor array panel comprising:
forming and patterning a first conductive layer on a substrate to form a first electrode of a first transistor and a first electrode of a second transistor;
sequentially forming a first insulating layer covering the first electrodes, a second conductive layer, a second insulating layer, and a third conductive layer;
patterning the first insulating layer, the second conductive layer, the second insulating layer, and the third conductive layer to form a spacing member and a second electrode of the first transistor and a spacing member and a second electrode of the second transistor, wherein a first portion of the spacing member of the first transistor is thicker than a second portion of the spacing member of the second transistor, the first portion overlapping with the first and second electrodes of the first transistor, and the second portion overlapping with the first and second electrodes of the second transistor; and
forming a semiconductor layer and a gate electrode of the first transistor and a semiconductor layer and a gate electrode of the second transistor,
wherein the spacing member of the first transistor includes a first insulator formed from the first insulating layer, a floating electrode formed from the second conductive layer, and a second insulator formed from the second insulating layer.

13. The method of claim 12, wherein:
the spacing member of the second transistor includes a first insulator formed from the first insulating layer.

14. The method of claim 13, wherein:
the second electrode of the first transistor is formed from the third conductive layer; and
the second electrode of the second transistor is formed from the second conductive layer.

15. The method of claim 13, wherein
the patterning of the first insulating layer, the second conductive layer, the second insulating layer, and the third conductive layer includes:
forming a first photosensitive film pattern including a first portion and a second portion having different thicknesses on the second insulating layer;
etching the third conductive layer by using the first photosensitive film pattern as a mask to form a third conductive layer pattern;
etching the second insulating layer by using the first photosensitive film pattern as a mask to form a second insulating layer pattern;
etching the second conductive layer by using the first photosensitive film pattern as a mask to form the floating electrode of the first transistor and the second electrode of the second transistor; and
etching the first insulating layer by using the first photosensitive film pattern as a mask to form the first insulator of the first transistor and the first insulator of the second transistor.

16. The method of claim 15, wherein
dry etching is used when etching the third conductive layer, the second insulating layer, and the first insulating layer, and wet etching is used when etching the second conductive layer.

17. The method of claim 15, wherein
the patterning of the first insulating layer, the second conductive layer, the second insulating layer, and the third conductive layer further includes:
patterning the first photosensitive film pattern by an etch-back method to form a secondary photosensitive film pattern; and
etching the third conductive layer pattern and the second insulating layer pattern by using the secondary photosensitive film pattern as a mask to form the second electrode and the second insulator of the first transistor.

18. The method of claim 17, wherein
dry etching is used when etching the third conductive layer pattern and the second insulating layer pattern.

19. The method of claim 12, wherein
the forming of the semiconductor layers and the gate electrodes of the first and second transistors includes:
sequentially depositing a semiconductor layer, a third insulating layer, and a fourth conductive layer;
etching the fourth conductive layer to form the gate electrodes of the first and second transistors;
etching the third insulating layer to form gate insulating layers of the first and second transistors; and
etching the semiconductor layer to form the semiconductor layers of the first and second transistors.

20. The method of claim 12, further comprising:
forming a planarization layer covering the first and second transistors; and forming a pixel electrode connected to the second electrode of the first transistor.

\* \* \* \* \*